United States Patent
Kothari et al.

(10) Patent No.: US 6,589,625 B1
(45) Date of Patent: Jul. 8, 2003

(54) HERMETIC SEAL AND METHOD TO CREATE THE SAME

(75) Inventors: Manish Kothari, San Mateo, CA (US); Clarence Chui, Emeryville, CA (US)

(73) Assignee: Iridigm Display Corporation, San Francisco, CA (US)

( * ) Notice: Subject to any disclaimer, the term of this patent is extended or adjusted under 35 U.S.C. 154(b) by 0 days.

(21) Appl. No.: 09/921,196

(22) Filed: Aug. 1, 2001

(51) Int. Cl.$^7$ ................................................ B32B 3/10
(52) U.S. Cl. ............................ 428/46; 428/49; 428/76; 428/751; 428/355 R; 428/192; 96/154
(58) Field of Search ............................ 428/47, 49, 428, 428/432, 46, 76, 351, 355 R, 192; 96/154

(56) References Cited

U.S. PATENT DOCUMENTS

| | | | |
|---|---|---|---|
| 4,036,360 A | 7/1977 | Deffeyes | 206/204 |
| 4,074,480 A | 2/1978 | Burton | 42/127 |
| 4,431,691 A | 2/1984 | Greenlee | 428/34 |
| 4,977,009 A | 12/1990 | Anderson et al. | |
| 5,244,707 A | 9/1993 | Shores | |
| 5,304,419 A | 4/1994 | Shores | |
| 5,591,379 A | 1/1997 | Shores | |
| 5,815,141 A | 9/1998 | Phares | 345/173 |
| 5,835,255 A | 11/1998 | Miles | 359/291 |
| 5,853,662 A | 12/1998 | Watanabe | 422/40 |
| 5,986,796 A | 11/1999 | Miles | 359/260 |
| 6,040,937 A | 3/2000 | Miles | 359/291 |
| 6,055,090 A | 4/2000 | Miles | 359/291 |
| 6,238,755 B1 | 5/2001 | Harvey et al. | 428/34 |

*Primary Examiner*—Cathy Lam
(74) *Attorney, Agent, or Firm*—Blakely, Sokoloff, Taylor & Zafman LLP

(57) ABSTRACT

An electronic display screen is created by processing a mirror on a substrate glass. A back plate glass is then placed on top of the substrate glass and sealed to the back plate glass. A hermetic seal that includes an adhesive mixed with zeolites is disclosed. The hermetic seal can seal the back plate glass with the substrate glass. The application of the hermetic seal is not limited to the electronic display screen. Rather, the hermetic seal can be used to seal a variety of surfaces including metals, polymers, plastics, alloys, ceramics and the like.

13 Claims, 1 Drawing Sheet

HERMETIC SEAL AND METHOD TO CREATE THE SAME

FIELD OF THE INVENTION

The present invention relates to a hermetic seal and methods to create the same. Specifically, a functional hermetic seal is disclosed that includes an adhesive mixed with an active component that can act as an absorbing filter on a molecular level.

BACKGROUND

To create an electronic display screen, a microelectromechanical systems (MEMS) based device such as a mirror is sandwiched between two glass plates: the back plate glass stand the substrate glass. The mirror is typically processed on the substrate glass. The back plate glass is then placed on top of the substrate glass to form the sandwich. The purpose of the back plate glass is to act as a viewing surface and to provide mechanical and environmental protection to the mirror. The sandwich is also referred to as the package.

The MEMS based device that is packaged in this manner is susceptible to problems associated with moisture and other harmful contaminants. The presence of moisture can cause stiction (static friction). The stiction can result because of the physical hydrogen bonding between the two glass surfaces in contact or because of the surface tension forces that result when the moisture between the two glass surfaces undergoes capillary condensation during the actuation of the MEMS based device. The presence of moisture can also cause electrochemical corrosion; for example, if the mirror includes an aluminum mirror.

The presence of harmful contaminants and moisture can pose a danger to the functioning of MEMS based device. For example, chlorine and moisture can combine to form an acidic environment that can be harmful to the MEMS based device. It is important that the package is moisture and contaminant free for the life of the device.

There are various channels by which water vapor or the contaminant can find its way inside the package. The moisture can enter the package from the environment in which the MEMS device is packaged. The moisture can permeate into the package from outside. The contaminant can be formed as a result of the outgassing of package components such as glass and polymers, especially at elevated temperatures.

In the prior art, to prevent the moisture and the contaminant from entering the package, the back plate glass and the substrate glass of the package are sealed to each other by using techniques such as welding and soldering, and by using o-rings. These prior art techniques are lacking in at least two respects. One, welding and soldering materials and o-rings occupy space. Real estate in MEMS based device packages is tight and there is a growing need for smaller form factors. Two, these prior art techniques do not eliminate the moisture and contaminants that are formed inside the package as a result of, for example, outgassing.

A simple technique to effectively seal two surfaces to each other that does not occupy additional real estate is desirable.

BRIEF DESCRIPTION OF THE DRAWING

The present invention is illustrated by way of example and not limitation in the figure of the accompanying drawing, in which.

SUMMARY OF THE INVENTION

Figure 1:
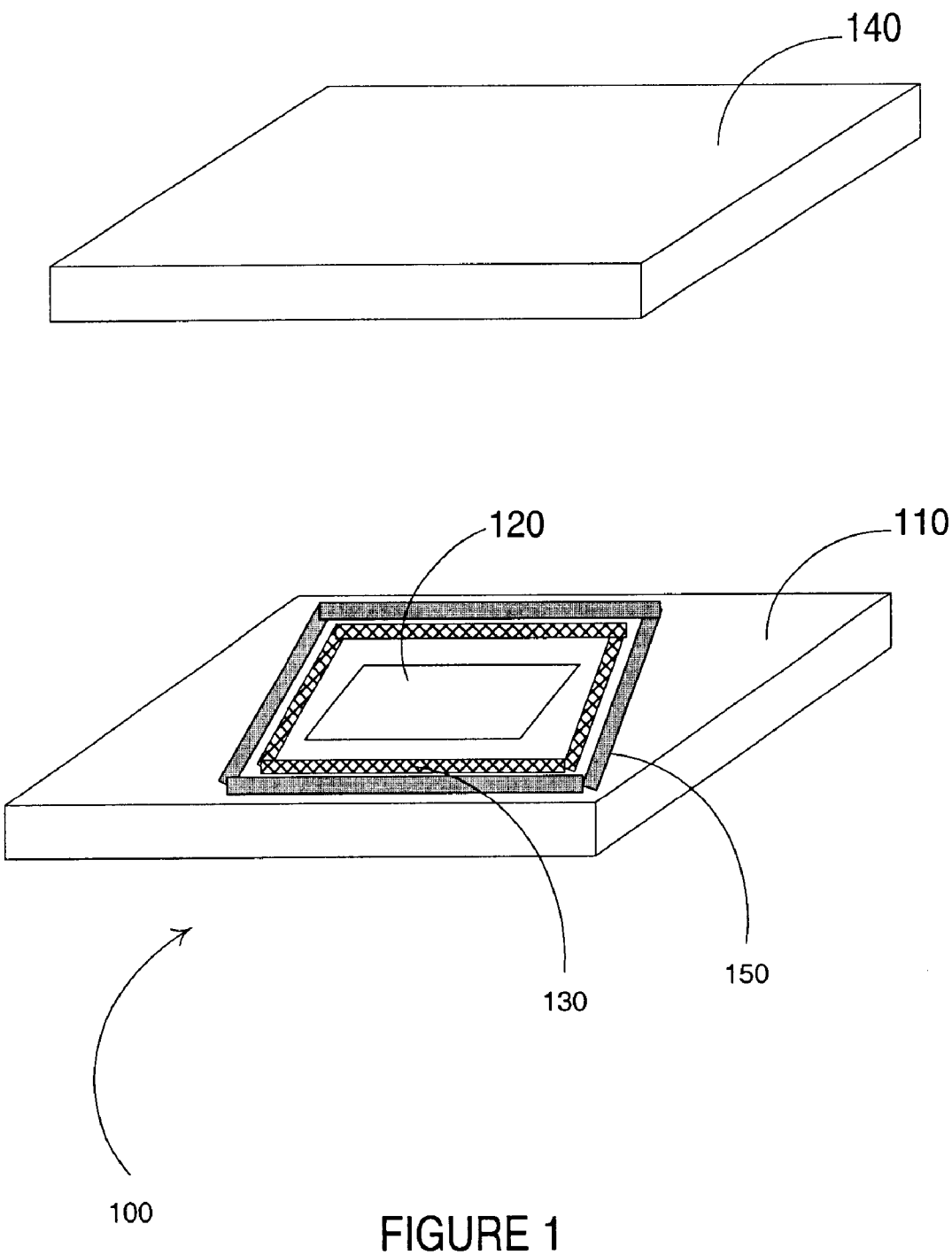
FIG. 1 illustrates an exemplary embodiment of package components that can be sealed with the hermetic seal of the present invention.

The hermetic seal including an adhesive mixed with an active component that can act as an absorbing filter on a molecular level is disclosed. The material can include a zeolite.

Additional features and advantages of the present invention will be apparent from the accompany drawing and the detailed description that follows.

DETAILED DESCRIPTION

In the following descriptions for the purposes of explanation, numerous details are set forth such as examples of specific materials and methods in order to provide a thorough understanding of the present invention. It will be apparent, however, to one skilled in the art that these specific details are not required in order to practice the present invention. In other instances, well known materials and methods have not been described in detail in order to avoid unnecessarily obscuring the present invention.

In this description, a hermetic seal and, methods to create the same are disclosed. The hermetic seal includes an adhesive mixed with molecular sieves or zeolites. In one embodiment, the zeolites can include aluminosilicate-structured minerals such as sodium aluminosilicate. In another embodiment, the zeoloites can include microporus silicate-structured minerals. It will be appreciated that active components other than zeolites that can act as absorbing filters on a molecular level can also be used. In one embodiment, the adhesive can include an adhesive with low outgassing numbers. In other embodiments, the adhesives can include adhesives with various outgassing numbers.

In one embodiment, the zeolites are mixed with the adhesive in a weight: ratio of 50:50. In other embodiments, the zeolites are mixed with the adhesive in various weight ratios. In one embodiment, the zeolites include zeolites in the powder form. In another embodiment, the zeolites include zeolites pellets. In yet another embodiment, the zeolites include zeolites beads.

The hermetic seal of the present invention can be applied as a bead between two surfaces to seal the two surfaces. The surfaces can include glass, metal, polymer, plastic, alloy or ceramic surfaces, or a combination thereof. The amount of bead that is applied can depend on the estimated amount of moisture or contaminant gases that will have to be removed from the package during the life of the package. This amount can be calculated by considering factors such as the amount of moisture/contamination that is present inside the package when the package is formed, the permeation rate of the adhesive, and the outgassing potential of the package components.

The zeolites can absorb water molecules at high temperatures. Zeolites of different pore sizes can be selected to absorb different contaminants. In one embodiment, the zeolites are selected to absorb contaminant molecules such as aromatic branched-chain hydrocarbons that have critical diameters of up to ten angstroms. In another embodiment, zeolites of pore sizes between two and three angstroms can be selected to absorb molecules of diameters less than two angstroms, namely hydrogen and moisture molecules. In yet another embodiment, zeolites of pore sizes of fifty angstroms are used to absorb nitrogen and carbon dioxide.

molecules. In yet another embodiment, the hermetic seal can include a mixture of zeolites of various pore sizes.

The hermetic seal of the present invention can be constructed in a simple manner without using techniques such as welding and soldering, or by using o-rings. The bead can be applied through a simple in-line manufacturing process. The bead occupies a negligible amount of real estate and it does not significantly bulk up the package. The hermetic seal includes active components in the form of zeolites that can trap the moisture and other contaminant gases in their pores. The hermetic seal provides mechanical support to the MEMS based device package.

FIG. 1 illustrates an exemplary embodiment of package components that can be sealed with the hermetic seal of the present invention. The components 100 for the MEMS based device in the form of a flat panel display are shown. The components include the substrate glass 110, the mirror 120, the hermetic seal bead 130 and the back plate glass 140. The mirror 120 is processed on the substrate glass 110. The bead 130 is applied to the substrate glass 110 around the perimeter of the mirror 120. The back plate glass 140 is placed on top of the substrate glass 110. The substrate glass 110 and the back plate glass 140 are sealed together by the bead 130 to form the package 100. In the ensuing description, the terms components 100 and package 100 are used interchangeably. Also, in the ensuing description, the terms bead 130 and hermetic seal 130 are used interchangeably.

The mirror 120 can be referred to as the MEMS based device or the MEMS structure. The package 100 can also be referred to as the glass sandwich. The package 100 formed by the components 100 can be a component of a flat panel display. An array of mirrors such as the mirror 120 can be processed on the substrate glass 110 to form the flat panel display. The back plate glass 140 serves as the viewing surface. The back plate glass 140 also serves a mechanical function because it prevents the user from touching the mirror 110.

The mirror 120 can be processed through conventional semiconductor technology processes. The mirror 120 can include a metallic mirror such as an aluminum mirror. It will be appreciated that in addition to the mirror 120, the package can include other display elements. It will be appreciated that clear plastic surfaces can replace the substrate glass 110 and the back plate glass 140.

The bead 130 can be applied around the perimeter of the mirror 120. For the embodiments in which the substrate glass 110 includes a plurality of mirrors 130, the bead 130 can be applied around the perimeter of the plurality of mirrors 120. In one embodiment, the bead 130 thickness is one hundred angstroms. In another embodiment, the bead 130 thickness is two hundred angstroms. In yet another embodiment, the bead 130 thickness is three hundred angstroms. In still other embodiments, beads 130 of various thicknesses that maintain a low form factor for the package 100 can be applied.

It will be appreciated that the application of the hermetic seal 130 of the present invention is not limited to the MEMS based products. The hermetic seal 130 can seal various surfaces of various devices and products. The hermetic seal 130 can seal surfaces including metals, plastics, polymers, ceramics, alloys and the like. The hermetic seal 130 of the present invention is ideal for the space critical environments because it occupies negligible real estate. The prior art seals that are formed by using techniques such as welding and soldering or by using o-rings can substantially bulk up the size of the package 100. The hermetic seal 130 can be applied through simple in-line manufacturing processes. The prior art techniques of welding and soldering require very high temperature processes that are expensive, can damage the package, and occupy valuable real estate.

The hermetic seal 130 acts as an environmental barrier by blocking humidity and chemical contaminants from entering the package 100. The hermetic seal 130 includes an adhesive mixed with an active component such as the zeolites. The adhesive alone, even a low permeation rate adhesive, cannot serve as a perfect environmental barrier because it eventually allows the contaminants and moisture to permeate. The active component can grab the contaminants and moisture that try to permeate into the package 100, instead of merely blocking their entry. The active component can grab the contaminant gases that result from outgassing of the components 100 after the package 100 is formed. The active component can grab the portion of the adhesive that evaporates into the package 100 while the adhesive is curing. The thickness of the bead 130 and the amount of active component that is mixed with the adhesive can depend on the package 100 estimated life time and the estimated amount of contaminants and moisture that can penetrate the package 100 during the expected life time.

In some embodiments, an outer bead 150 of adhesive is applied around the perimeter of the bead 130. The outer bead 150 can include a low permeation rate adhesive. The outer bead 150 can provide additional environmental protection to the package 100. The outer bead can be useful for the aggressive environment in which the bead 130 alone cannot serve as an effective hermetic seal without being loaded with an impractical amount of the active component. If the bead 130 includes a very high portion of zeoilites in the zeolites-adhesive mixture, for example more than sixty percent zeolites by weight, the bead 130 can become microscopically porous. The bead 130 can also become highly non-viscous and thus difficult to apply. Also, the bead 130 with a high percentage of zeolite by weight may not provide a robust mechanical support to the package 100. In aggressive environments, the application of the outer bead 150 can slow down the penetration process of contaminants and moisture into the package 100.

In the foregoing specification, the invention has been described with reference to specific exemplary embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A micro-electromechanical systems based device package comprising:
    a back plate glass;
    a substrate glass;
    a bead of an adhesive mixed with a zeolite applied between the back plate glass and the substrate glass; and
    a mirror processed on the substrate glass.

2. The micro-electromechanical systems based device package of claim 1, including the bead being applied around the perimeter of the mirror.

3. The micro-electromechanical systems based device package of claim 1, wherein the bead acts as a hermetic seal.

4. The micro-electromechanical systems based device package of claim 1, wherein the bead traps moisture and other contaminant gases that can be harmful to the mirror.

5. The micro-electromechanical systems based device package of claim 1, wherein the micro-electromechanical systems device includes an electronic display screen.

6. A micro-electromechanical systems based device package comprising:
- a back plate glass;
- a substrate glass; and
- a bead of an adhesive mixed with zeolites of different pore sizes applied between the back plate glass and the substrate glass, wherein the zeolites of different pore sizes are selected to absorb molecules of different diameters.

7. The micro-electromechanical systems based device package of claim 6, wherein some of the zeolites have a pore size to allow absorption of molecules having a diameter of up to ten angstroms.

8. The micro-electromechanical systems based device package of claim 6, wherein some of the zeolites have a pore size to allow absorption of molecules having a diameter of less than two angstroms.

9. The micro-electromechanical systems based device package of claim 6, wherein the pore sizes of some of the zeolites allow absorption of nitrogen and carbon dioxide molecules.

10. A micro-electromechanical systems based device package comprising:
- a back plate glass;
- a substrate glass; and
- a bead of an adhesive mixed with a zeolite applied between the back plate glass and the substrate glass, wherein the zeolite is selected to have a pore size which allows the zeolite to absorb a contaminant gas that is outgassed by components of the package, and wherein said pore size is up to fifty Angstroms.

11. The micro-electromechanical systems based device package of claim 10, wherein the zeolite has a pore size that allows it to absorb aromatic branched-chain hydrocarbons.

12. The micro-electromechanical systems based device package of claim 10, wherein the zeolite has a pore size that allows it to absorb hydrogen molecules.

13. The micro-electromechanical systems based device package of claim 10, wherein the zeolite has a pore size that allows it to absorb nitrogen and carbon dioxide molecules.

\* \* \* \* \*